US010236326B2

(12) United States Patent
Lee et al.

(10) Patent No.: US 10,236,326 B2
(45) Date of Patent: Mar. 19, 2019

(54) ORGANIC LIGHT EMITTING DISPLAY DEVICE HAVING SUB PIXELS OF DIFFERENT AREAS AND DISTANCES

(71) Applicant: LG DISPLAY CO., LTD., Seoul (KR)

(72) Inventors: Jung-Min Lee, Paju-si (KR); JungChul Kim, Paju-si (KR); WooChan Kim, Goyang-si (KR)

(73) Assignee: LG DISPLAY CO., LTD., Seoul (KR)

(*) Notice: Subject to any disclaimer, the term of this patent is extended or adjusted under 35 U.S.C. 154(b) by 19 days.

(21) Appl. No.: 15/369,375

(22) Filed: Dec. 5, 2016

(65) Prior Publication Data

US 2017/0287988 A1 Oct. 5, 2017

(30) Foreign Application Priority Data

Apr. 1, 2016 (KR) .................. 10-2016-0040490
Jul. 29, 2016 (KR) .................. 10-2016-0097080

(51) Int. Cl.
*H01L 27/32* (2006.01)
*H01L 51/52* (2006.01)
*G09G 3/3208* (2016.01)

(52) U.S. Cl.
CPC ........ *H01L 27/3218* (2013.01); *H01L 27/326* (2013.01); *H01L 27/3216* (2013.01); *H01L 51/5278* (2013.01); *G09G 3/3208* (2013.01); *G09G 2300/0452* (2013.01); *G09G 2300/0465* (2013.01); *G09G 2320/043* (2013.01)

(58) Field of Classification Search
CPC . H01L 27/3218; H01L 27/326; H01L 51/278; H01L 27/3216

USPC .......................... 257/40, 59, 79, 98
See application file for complete search history.

(56) References Cited

U.S. PATENT DOCUMENTS

| 7,417,648 B2 | 8/2008 | Credelle |
| 7,443,093 B2 | 10/2008 | Jianpu et al. |
| 7,663,299 B2* | 2/2010 | Chao .................. H01L 27/3216 313/500 |
| 8,159,117 B2 | 4/2012 | Karaki et al. |
| 8,253,323 B2 | 8/2012 | Sung et al. |
| 8,330,352 B2 | 12/2012 | Sung et al. |

(Continued)

FOREIGN PATENT DOCUMENTS

| JP | 2008-209902 A | 9/2008 |
| JP | 2012-28170 A | 2/2012 |

(Continued)

*Primary Examiner* — Lex H Malsawma
*Assistant Examiner* — Eric W Jones
(74) *Attorney, Agent, or Firm* — Birch, Stewart, Kolasch & Birch, LLP

(57) ABSTRACT

Provided is an organic light emitting display device including a plurality of sub pixels. Areas of emission regions of green sub pixels of the plurality of sub pixels are the same as or larger than an area of an emission region of at least one non-green sub pixel of the plurality of sub pixels. Also the organic light emitting display device includes an area of an emission region of a green sub pixel having a low luminance lifetime being the same as or larger than areas of emission regions of non-green sub pixels. Accordingly, it is possible to make the luminance lifetime of the green sub pixel and the luminance lifetimes of the non-green sub pixels uniform. Further, it is possible to minimize a color change of the organic light emitting display device.

21 Claims, 7 Drawing Sheets

(56) References Cited

U.S. PATENT DOCUMENTS

| | | | |
|---|---|---|---|
| 8,338,832 B2 | 12/2012 | Kim | |
| 8,552,635 B2 | 10/2013 | Kim et al. | |
| 8,716,929 B2 | 5/2014 | Yoo et al. | |
| 8,754,913 B2 | 6/2014 | Hwang et al. | |
| 8,994,015 B2 | 3/2015 | Pyon et al. | |
| 9,041,625 B2 | 5/2015 | Hwang et al. | |
| 9,307,584 B2 | 4/2016 | Ko | |
| 9,318,537 B2 | 4/2016 | Sung et al. | |
| 9,324,262 B2 | 4/2016 | Kim et al. | |
| 2005/0110398 A1* | 5/2005 | Lee | H01L 27/3211 313/504 |
| 2005/0218792 A1* | 10/2005 | Jianpu | H01L 27/3213 313/502 |
| 2009/0026447 A1 | 1/2009 | Ito et al. | |
| 2009/0302331 A1 | 12/2009 | Smith et al. | |
| 2011/0025723 A1 | 2/2011 | Kim | |
| 2013/0234917 A1 | 9/2013 | Lee | |
| 2014/0014985 A1 | 1/2014 | Sonoda et al. | |
| 2014/0071030 A1* | 3/2014 | Lee | G09G 3/3208 345/82 |
| 2014/0306198 A1* | 10/2014 | Im | H01L 51/0013 257/40 |
| 2015/0015466 A1 | 1/2015 | Feng | |
| 2015/0015600 A1* | 1/2015 | Yang | G09G 3/2003 345/600 |
| 2015/0102320 A1* | 4/2015 | Jung | H01L 27/3218 257/40 |
| 2015/0162391 A1* | 6/2015 | Kim | H01L 27/3218 257/40 |
| 2015/0364526 A1 | 12/2015 | Peng et al. | |
| 2016/0057817 A9 | 2/2016 | Ko | |
| 2016/0197123 A1 | 7/2016 | Sung et al. | |
| 2016/0197125 A1 | 7/2016 | Ko | |

FOREIGN PATENT DOCUMENTS

| | | |
|---|---|---|
| KR | 10-0560789 B1 | 3/2006 |
| KR | 10-0729077 B1 | 6/2007 |
| KR | 10-2008-0035774 A | 4/2008 |
| KR | 10-2009-0049515 A | 5/2009 |
| KR | 10-2010-0001598 A | 1/2010 |
| KR | 10-2011-0013691 A | 2/2011 |
| KR | 10-1066411 B1 | 9/2011 |
| KR | 10-2011-0117612 A | 10/2011 |
| KR | 10-2011-0117613 A | 10/2011 |
| KR | 10-2011-0129531 A | 12/2011 |
| KR | 10-2012-0020087 A | 3/2012 |
| KR | 10-2013-0007309 A | 1/2013 |
| KR | 10-2013-0025741 A | 3/2013 |
| KR | 10-2013-0101874 A | 9/2013 |
| KR | 10-2014-0020120 A | 2/2014 |
| KR | 10-2014-0111505 A | 9/2014 |
| KR | 10-2015-0007261 A | 1/2015 |
| KR | 10-2015-0007992 A | 1/2015 |
| KR | 10-2015-0107883 A | 9/2015 |
| KR | 10-2015-0122564 A | 11/2015 |
| KR | 10-2016-0018936 A | 2/2016 |
| KR | 10-2016-0019243 A | 2/2016 |
| KR | 10-2016-0029376 A | 3/2016 |

* cited by examiner

ORGANIC LIGHT EMITTING DISPLAY DEVICE HAVING SUB PIXELS OF DIFFERENT AREAS AND DISTANCES

CROSS-REFERENCE TO RELATED APPLICATIONS

This application claims the priority benefit of Korean Patent Application No. 10-2016-0040490 filed on Apr. 1, 2016, and No. 10-2016-0097080 filed on Jul. 29, 2016, all of which are hereby incorporated by reference as if fully set forth herein.

BACKGROUND OF THE INVENTION

Field of the Invention

The present disclosure relates to an organic light emitting display device and more particularly, to an organic light emitting display device in which the luminance deviation depending on the lifetime of sub pixels is minimized.

Description of the Related Art

Recently, as society advances to the information society, the field of display devices which visually express electrical information signals is rapidly advancing. Thus, various display devices having excellent performance, such as thinness, lightness, and low power consumption have been developed.

In detail, a liquid crystal display (LCD), a plasma display panel device (PDP), a field emission display device (FED), and an organic light emitting display device (OLED) can be exemplified as those display devices.

In particular, the organic light emitting display device that is a self-emission device has advantages such as a high response time and a high emission efficiency, a high luminance, and a wide viewing angle as compared with the other display devices. Therefore, the OLED device is attracting much attention.

Further, an organic light emitting diode (OLED) that is used for the organic light emitting display device is a next-generation light source having the characteristic of self-luminance and has excellent advantages in terms of the viewing angle, the contrast, the response time, and the power consumption in comparison to liquid crystals. Further, an organic light emitting diode has a surface emitting structure, so it is easily made in a flexible type.

An organic light emitting display device includes a plurality of sub pixels composed of red sub pixels, green sub pixels, and blue sub pixels. The red sub pixel, the green sub pixel, and the blue sub pixel respectively emit red, green, and blue light, and a full-color image can be provided by a plurality of sub pixels.

Sub pixels each have an organic light emitting diode and the organic light emitting diode may include a plurality of organic layers. Organic light emitting diodes have different thicknesses and organic layers, depending on the color of the light to emit. When an organic light emitting diode is used for a long period of time, the luminance that can be achieved from the same driving current may be gradually decreased due to deterioration of the organic layers. In this instance, the degrees of luminance reduction according to time (that is, luminance lifetimes) of sub pixels may become different. Under this circumstance, when an organic light emitting display device is used for a long period of time, since the degrees of luminance reduction of sub pixels are different, the color of the organic light emitting display device changes. In particular, the white color that is generated when all of red, green, and blue sub pixels are turned on severely changes.

SUMMARY OF THE INVENTION

The inventor(s) has recognized that the organic light emitting diodes of the sub pixels in an organic light emitting display device have different luminance lifetimes, whereby the luminance of the sub pixels is deteriorated at different speeds as time passes. Accordingly, the inventor(s) has designed an organic light emitting display device that can supplement the luminance that reduces differently in sub pixels by giving different areas to emission regions of the sub pixels.

Therefore, an object of the present disclosure is to provide an organic light emitting display device that can display an image having uniformity of a color even if it is used for a long period of time by determining the areas of emission regions of sub pixels on the basis of the luminance lifetimes of the sub pixels.

Another object of the present disclosure is to provide an organic light emitting display device having minimum defects that may be generated in the process of forming sub pixels by disposing the emission regions of the sub pixels in a zigzag pattern in a symmetric shape.

It should be noted that objects of the present disclosure are not limited to the above-mentioned object and other objects of the present disclosure will be apparent to those skilled in the art from the following descriptions.

According to an aspect of the present disclosure, there is provided an organic light emitting display device. The organic light emitting display device includes a plurality of sub pixels. Areas of emission regions of green sub pixels of the plurality of sub pixels are the same as or larger than an area of an emission region of at least one non-green sub pixel of the plurality of sub pixels. In the organic light emitting display device according to an embodiment of the present disclosure, the area of the emission region of the green sub pixel having a low luminance lifetime is the same as or larger than the areas of the emission regions of the non-green sub pixels. Accordingly, it is possible to make the luminance lifetime of the green sub pixel and the luminance lifetimes of the non-green sub pixels uniform. Further, it is possible to minimize a color change of the organic light emitting display device.

According to another aspect of the present disclosure, there is provided an organic light emitting display device. The organic light emitting display device includes a plurality of sub pixels. Areas of emission regions of each of the plurality of sub pixels are adjusted based on a luminance lifetime per unit area of each of the plurality of sub pixels. The luminance lifetime per unit area of the each of the plurality of sub pixels is a time to be taken until a luminance of each of the plurality of sub pixels reaches 95% of an initial luminance thereof, and a rate of variation in the luminance lifetime per unit area of the plurality of sub pixels is within 1%. Since the organic light emitting display device according to another aspect of the present disclosure includes a plurality of sub pixels having emission regions determined on the basis of a luminance lifetime per unit area, a color change of the organic light emitting display device due to differences in luminance lifetimes of the sub pixels may be minimized.

The details of other example embodiments are included in the following detailed description and the accompanying drawings.

According to the present disclosure, since the areas of the emission regions are adjusted on the based on the luminance lifetimes of the sub pixels, the plurality of sub pixels can have substantially the same luminance lifetime. Further, the color change of the organic light emitting display device can be minimized even if the organic light emitting display device is used for a long period of time.

According to the present disclosure, the emission regions of the sub pixels are disposed transversely in a zigzag pattern and are each symmetric. Accordingly, it is possible to effectively distribute stress generated at opening areas of an FMM (Fine Metal Mask) during deposition using the FMM. Further, it is possible to minimize defects that may be generated during deposition using the FMM.

According to the present disclosure, the emission regions of the sub pixels are each symmetric. Accordingly, a luminance difference can be reduced even if the organic light emitting display device is used for a long period of time. Further, a change in white color coordinate of the organic light emitting display device can be minimized.

According to the present disclosure, the emissions regions of the sub pixels are each symmetric. Accordingly, it is possible to minimize color mixture of the sub pixels due to overlapping of the emission regions of the sub pixels by a difference in a tensile force in the FMM that may be caused during mask deposition. The effects of the present disclosure are not limited to the aforementioned effects, and other various effects are included in the present specification.

BRIEF DESCRIPTION OF THE DRAWINGS

The above and other aspects, features and other advantages of the present disclosure will be more clearly understood from the following detailed description taken in conjunction with the accompanying drawings, in which.

DETAILED DESCRIPTION OF THE EMBODIMENTS

Figure 1:
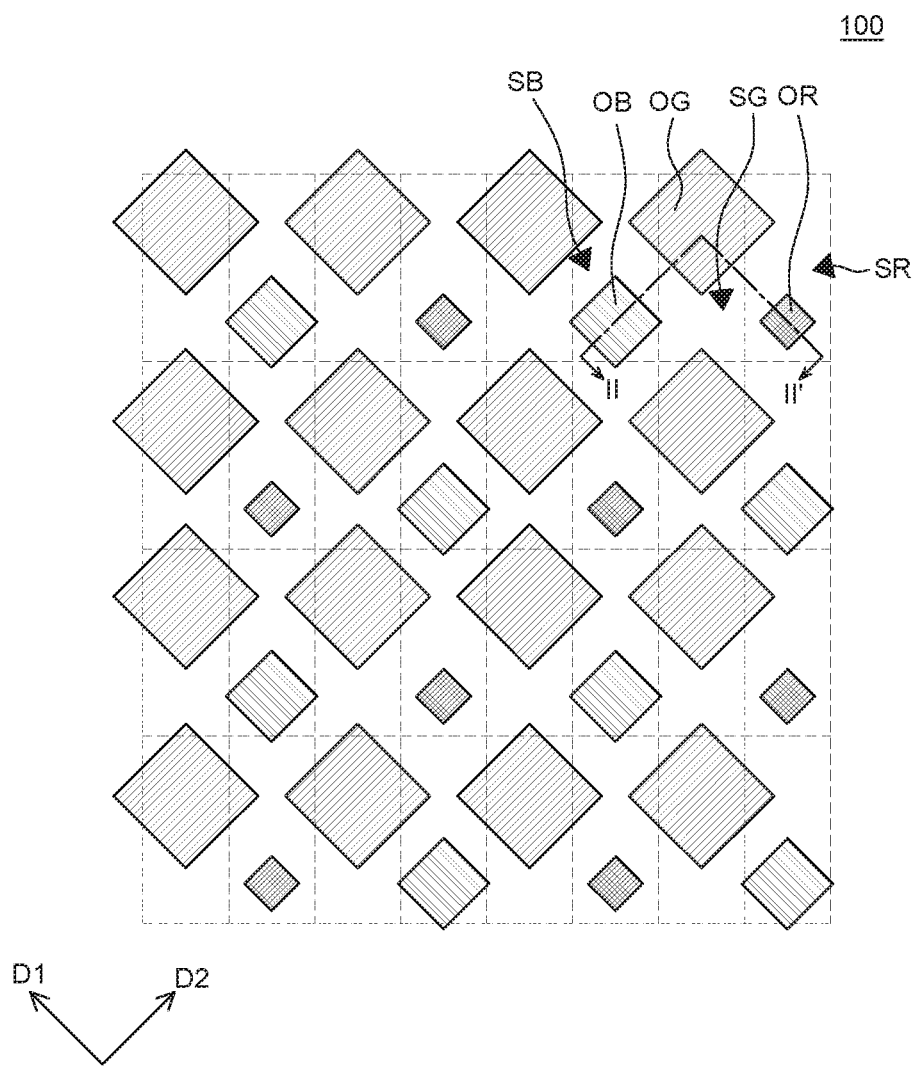
FIG. 1 is a schematic plan view illustrating an organic light emitting display device according to an embodiment of the present disclosure.

Advantages and features of the present disclosure, and methods for accomplishing the same will be more clearly understood from example embodiments described below with reference to the accompanying drawings. However, the present disclosure is not limited to the following example embodiments but may be implemented in various different forms. The example embodiments are provided only to complete disclosure of the present disclosure and to fully provide a person having ordinary skill in the art to which the present disclosure pertains with the category of the disclosure, and the present disclosure will be defined by the appended claims.

The shapes, sizes, ratios, angles, numbers, and the like illustrated in the accompanying drawings for describing the example embodiments of the present disclosure are merely examples, and the present disclosure is not limited thereto. Same reference numerals generally denote same elements throughout the present specification. Further, in the following description, a detailed explanation of known related technologies may be omitted to avoid unnecessarily obscuring the subject matter of the present disclosure. The terms such as "including," "having," and "comprising" used herein are generally intended to allow other components to be added unless the terms are used with the term "only". Any references to singular may include plural unless expressly stated otherwise.

Components are interpreted to include an ordinary error range even if not expressly stated.

When the position relation between two parts is described using the terms such as "on", "above", "below", and "next", one or more parts may be positioned between the two parts unless the terms are used with the term "immediately" or "directly".

When an element or layer is referred to as being "on" another element or layer, it may be directly on the other element or layer, or intervening elements or layers may be present.

Although the terms "first", "second", and the like are used for describing various components, these components are not confined by these terms. These terms are merely used for distinguishing one component from the other components. Therefore, a first component to be mentioned below may be a second component in a technical concept of the present disclosure.

Throughout the whole specification, the same reference numerals denote the same elements.

Since size and thickness of each component illustrated in the drawings are represented for convenience in explanation, the present disclosure is not necessarily limited to the illustrated size and thickness of each component.

The features of various embodiments of the present disclosure can be partially or entirely bonded to or combined with each other and can be interlocked and operated in technically various ways, and the embodiments can be carried out independently of or in association with each other.

Hereinafter, various embodiments of the present disclosure will be described in detail with reference to the accompanying drawings.

Figure 2:
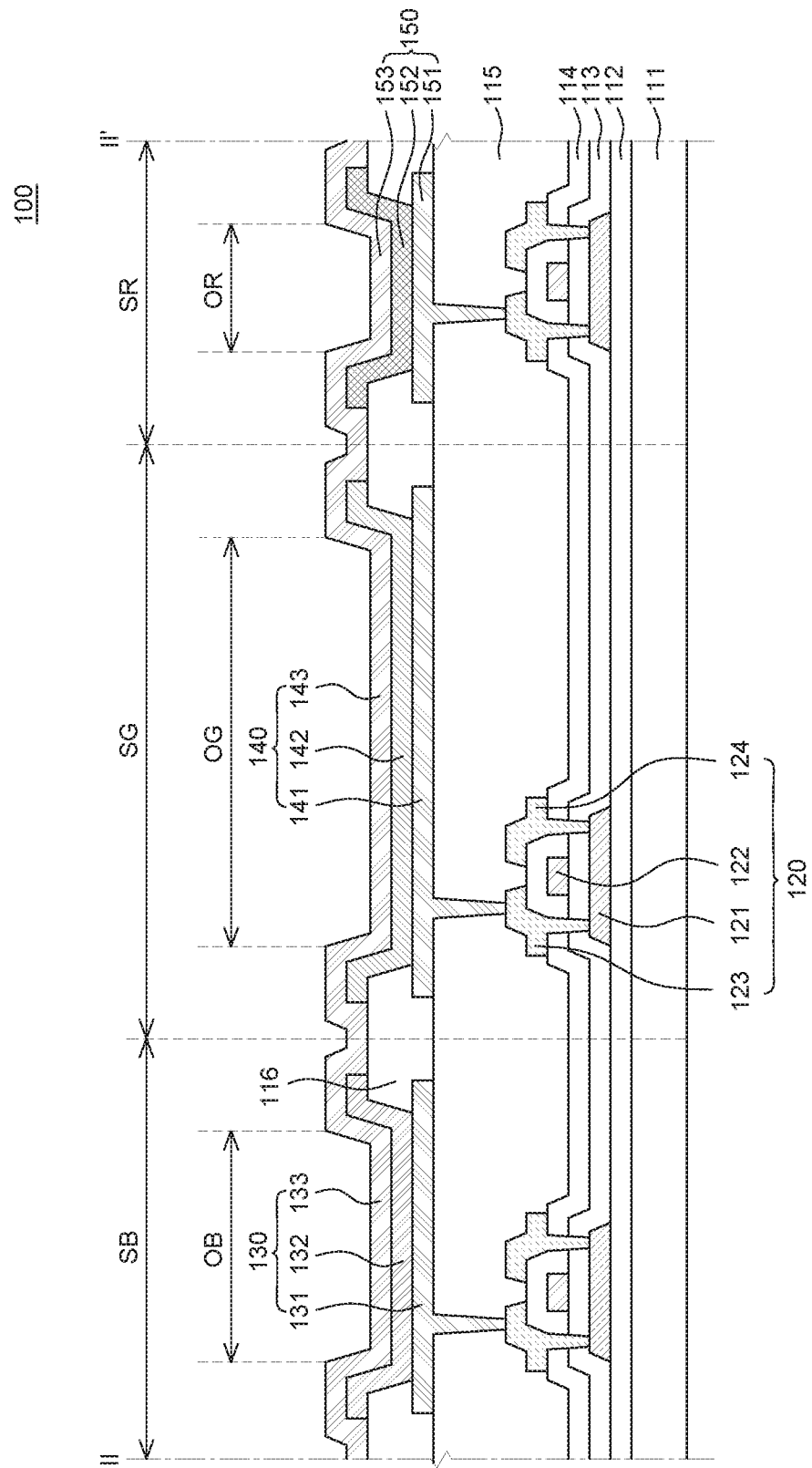
FIG. 2 is a schematic cross-sectional view taken along line II-II' in FIG. 1 to illustrate an organic light emitting display device according to an embodiment of the present disclosure.

FIG. 1 is a schematic plan view illustrating an organic light emitting display device according to an embodiment of the present disclosure. FIG. 2 is a schematic cross-sectional view taken along line II-II' in FIG. 1 to illustrate an organic light emitting display device according to an embodiment of the present disclosure. FIG. 1 schematically shows disposition of only sub pixels SR, SG, and SB in an organic light emitting display device 100 without detailed components of the organic light emitting display device 100 other than the sub pixels SR, SG, and SB.

Referring to FIG. 1, the organic light emitting display device 100 includes a plurality of sub pixels SR, SG, and SB. The sub pixels SR, SG, and SB are each an element for showing one color and one cell bordered by a dotted line may be one among the sub pixels SR, SG, and SB. The sub pixels SR, SG, and SB include emission regions OR, OG, and OB through which light is emitted and non-emission regions through which light is not emitted. The hatched areas are the emission regions OR, OG, and OB and the other non-hatched areas are non-emission regions in FIG. 1.

The plurality of sub pixels SR, SG, and SB show specific colors in the organic light emitting display device 100. For example, the plurality of sub pixels SR, SG, and SB include a red sub pixel SR, a green sub pixel SG, and a blue sub pixel SB, and emit red, green, and blue light, respectively. However, the sub pixels of the organic light emitting display device 100 are not limited thereto and the organic light emitting display device 100 may further include a white sub pixel other than the red sub pixel SR, the green sub pixel SG, and the blue sub pixel SB.

The red sub pixel SR, the green sub pixel SG, and the blue sub pixel SB, as shown in FIG. 2, respectively include organic light emitting diodes 130, 140, and 150 that emit light and a thin film transistor that applies a driving voltage to the organic light emitting diodes 130, 140, and 150. The thin film transistors 120 in the red sub pixel SR, the green sub pixel SG, and the blue sub pixel SB have the same structure, and the organic light emitting diodes 130, 140, and 150 of the red sub pixel SR, the green sub pixel SG, and the blue sub pixel SB are substantially the same, except a type of organic materials included in the organic layer. Accordingly, the green sub pixel SG is representatively described hereafter.

A substrate 111 supports and protects components of the organic light emitting display device 100. The substrate 111 may be made of an insulating material, for example, flexible materials such as glass-based or polyimide-based materials. When the light emitting display device 100 has flexibility, it may be formed of a soft material such as plastic. Further, when an organic light emitting diode that can be easily formed in a flexible type is applied to an automotive lighting system or an automotive display device, the automotive lighting system or the automotive display device can be freely designed in various ways to adjust the structure or the external shape of a vehicle.

The organic light emitting display device 100 according to an embodiment of the present disclosure may be applied to display devices including a TV, a mobile device, a tablet PC, a monitor, a laptop computer, and an automotive display device. Further, the organic light emitting display device 100 may be applied to a wearable display device, a foldable display device, and a rollable or bendable display device.

A buffer layer 112 is disposed on the substrate 111. The buffer layer 112 can suppress penetration of water or impurities through the substrate 111 and planarize the upper portion of the substrate 111. The buffer layer 112 is not a necessary component. Whether to form the buffer layer 112 depends on the type of the substrate 111 or the type of the thin film transistor 120 to be applied to the organic light emitting display device 100.

The thin film transistor 120 is disposed on the buffer layer 112 and supplies signals to the green organic light emitting diode 140. The thin film transistor 120 includes an active layer 121, a gate electrode 122, a source electrode 123, and a drain electrode 124. In detail, the active layer 121 is formed on the buffer layer 112 and a gate insulation layer 113 for insulation between the active layer 121 and the gate electrode 122 is formed on the active layer 121. Further, the gate electrode 122 is formed on the gate insulation layer 113 and overlaps the active layer 121 and an interlayer insulation layer 114 is formed on the gate electrode 122 and the gate insulation layer 113. The source electrode 123 and the drain electrode 124 are formed on the interlayer insulation layer 114. The source electrode 123 and the drain electrode 124 are electrically connected with the active layer 121.

The active layer 121 may be formed of amorphous silicon (a-Si), polycrystalline silicon (poly-Si), an oxide semiconductor, or an organic semiconductor, etc. When the active layer 121 is formed of an oxide semiconductor, an ITO (Indium Tin Oxide), an IZO (Indium Zinc Oxide), an IGZO (Indium Gallium Zinc Oxide), or an ITZO (Indium Tin Zinc Oxide) may be used, but it is not limited thereto. When the active layer 121 is formed of an IGZO, the ratio of In:Ga:Zn may be 1:2:1. In this instance, a Ga-rich layer may be formed on the IGZO layer in the active layer 121. The Ga-rich layer can reduce PBTS (Positive Bias Temperature Stress), so the reliability of an organic light emitting display device can be improved. Thin film transistors connected with anodes 131, 141, and 151 of the organic light emitting diodes 130, 140, and 150 among various thin film transistors 120 that can be included in each of the sub pixels SR, SG, and SB are shown for the convenience of description in FIG. 2. However, each of the sub pixels SR, SG, and SB may include a switching thin film transistor or a capacitor for driving the organic light emitting diodes 130, 140, and 150. Further, although the present disclosure assumes that the thin film transistors 120 have a coplanar structure, a thin film transistor having an inverted staggered structure may be used. Further, the anodes 131, 141, and 151 of the organic light emitting diodes 130, 140, and 150 of each of the sub pixels SR, SG, and SB are connected to the source electrodes 123 of the thin film transistors 120 in the figure. However, the anodes 131, 141, and 151 of the organic light emitting diodes 130, 140, and 150 may be respectively connected to the drain electrodes 124 of the thin film transistor 120.

A planarization layer 115 is disposed on the thin film transistors 120. The planarization layer 115 is a layer for planarizing the upper portion of the substrate 111 and may be formed of an organic insulation material to cover steps on the top of the substrate 111. The planarization layer 115 has contact holes for electrically connecting the anode 131 of the blue sub pixel SB, the anode 141 of the green sub pixel SG, and the anode 151 of the red sub pixel SR respectively to the source electrodes 123 of the thin film transistors 120 of the sub pixels SR, SG, and SB.

The blue organic light emitting diode 130, the green organic light emitting diode 140, and the red organic light emitting diode 150 are disposed on the planarization layer 115. And each of the blue organic light emitting diode 130, the green organic light emitting diode 140, and the red organic light emitting diode 150 includes anodes 131, 141, and 151, organic layers 132, 142, and 152, and cathodes 133, 143, and 153. The green organic light emitting diode 140 will be representatively described in the following description for explaining convenience, but the blue organic light emitting diode 130 and the red organic light emitting diode 150 may be configured in the same way.

The anode 141 of the green organic light emitting diode 140 is an electrode supplying a hole to the organic layer 142 of the green organic light emitting diode 140, and may be formed of a transparent conductive material having a high work function. That transparent conductive material may include an indium tin oxide (ITO), an indium zinc oxide (IZO), or an ITZO (indium tin zinc oxide). When the organic light emitting display device 100 is operated in a top emission type, as in FIG. 2, the anode 141 may further include a reflective layer. The anode 151 of the red organic light emitting diode 150, the anode 141 of the green organic light emitting diode 140, and the anode 131 of the blue organic light emitting diode 130 are separated from each other and independently connected to the thin film transistors 120. The anode 151 of the red organic light emitting diode 150, the anode 141 of the green organic light emitting diode 140, and the anode 131 of the blue organic light emitting diode 130 are provided for the sub pixels, respectively, so the anodes 131, 141, and 151 may be referred to as pixel electrodes.

The cathode 143 of the green organic light emitting diode 140 is an electrode that supplies electrons and may be formed of a metallic material having a relatively low work function, for example, silver (Ag), titanium (Ti), aluminum (Al), molybdenum (Mo), an alloy (Ag:Mg) of silver (Ag) and magnesium (Mg), or an alloy (Mg:LiF) of magnesium (Mg) and lithium fluoride (LiF). The cathode 143 may be formed of at least two or more layers. When the cathode 143 is formed of an alloy (Ag:Mg) of silver (Ag) and magnesium (Mg), it is possible to reduce resistance of the cathode 143 by forming the silver (Ag) having a content higher than that of magnesium (Mg). An ytterbium (Yb) layer may be disposed on, under, or on and under the Ag:Mg layer to suppress decrease of resistance due to oxidation of silver (Ag). The cathode 153 of the red organic light emitting diode 150, the cathode 143 of the green organic light emitting diode 140, and the cathode 133 of the blue organic light emitting diode 130 are connected to each other and commonly connected to all the sub pixels. Accordingly, the cathodes may be referred to as common electrodes.

The organic layer 142 may include a green organic light emitting layer. The organic light emitting display device 100 may have a patterned emission layer structure, if necessary. In an organic light emitting display device having a patterned emission layer structure, light emitting layers emitting different colors are separated for respective pixels. For example, a red organic light emitting layer for emitting red light, a green organic light emitting layer for emitting green light, and blue organic light emitting layer for emitting blue light may be separated for the red sub pixel SR, the green sub pixel SG, and the blue sub pixel SB, respectively. Light is emitted from the red organic light emitting layer, the green organic light emitting layer, and the blue organic light emitting layer by combination of a hole and an electron supplied through the anodes and the cathodes. Each of the organic light emitting layers may be deposited and patterned on each of the emission regions OR, OG, and OB through an apertured mask, for example an FMM (Fine Metal Mask).

The red organic light emitting layer, the green organic light emitting layer, and the blue organic light emitting layer each include at least one host and dopant. At least one host may be a mixed host of a hole-type host and an electron-type host. When the host is a mixed host, combination of a hole and an electron in the organic light emitting layer can be improved, so the lifetime of the organic light emitting layer can be improved. For example, the red organic light emitting layer and the green organic light emitting layer include phosphorescent host and dopant and the blue organic light emitting layer includes fluorescent host and dopant. A dopant emits light of a specific wavelength using transition energy of a host from an organic light emitting layer. Accordingly, appropriate materials can be selected and used to form a red organic light emitting layer, a green organic light emitting layer, and a blue organic light emitting layer.

Since the red organic light emitting layer and the green organic light emitting layer include phosphorescent organic materials, so they emit light on the basis of triplet exciton, while the blue organic light emitting layer includes a fluorescent organic materials, so it emits light on the basis of singlet exciton. The probability of production of a triplet exciton is 75%, which is larger than 25% that is the probability of production of a singlet exciton, so the emission efficiency of the red organic light emitting layer and the green organic light emitting layer that emit light on the basis of a triplet exciton is higher than that of the blue organic light emitting layer.

In detail, the red organic light emitting layer and the green organic light emitting layer may include, as a phosphorescent host, 1,3-bis(carbazol-9-yl)benzene (mCP), 1,3,5-tris (carbazol-9-yl)benzene (TCP), 4,4',4"-tris(carbazol-9-yl)triphenylamine (TcTa), 4,4'-bis(carbazol-9-yl)biphenyl (CBP), 4,4'-bis(carbazol-9-yl)-2,2'-dimethylbiphenyl (CDBP), 2,7-bis(carbazol-9-yl)-9,9-dimethylfluorene (DMFL-CBP), 9,9-bis[4-(carbazol-9-yl)-phenyl]fluorene (FL-2CBP), and 2,7-bis(carbazol-9-yl)-9,9-ditolylfluorene (DPFL-CBP) etc. However, the phosphorescent hosts of the red organic light emitting layer and the green organic light emitting layer are not limited thereto.

The blue organic light emitting layer may include, as a fluorescent host, Tris(8-hydroxy-quinolinato)aluminum ($Alq_3$), 9,10-di(naphth-2yl)anthracene (ADN), 3-tert-butyl-9,10-di(naphth-2-yl)anthracene (TBADN), (4,4'-bis(2,2-diphenylvinyl)-1,1'-biphenyl) (DPVBi), 1,3,5-tri(pyren-1-yl) benzene (TPB3), 9,9-bis[4-(pyrenyl)phenyl]-9H-fluorene (BPPF), 2,2'-bi(9,10-diphenyl-anthracene) (TPBA), 3,9-di (naphthalen-2-yl)perylene or 3,10-di(naphthalen-2-yl) perylene mixture (DNP) etc. However, the host of the blue organic light emitting layer is not limited thereto.

Further, the dopant of the red organic light emitting layer may be $Ir(btp)_2$ (acac) (bis(2-benzo[b]thiophen-2-yl-pyridine) (acetylacetonate) (iridium) (III)), $Ir(piq)_2$ (acac) (bis (1-phenylisoquinoline) (acetylacetonate)iridium (III)), $Ir(piq)_3$ (tris(1-phenylisoquinoline)iridium (III)), or Rubrene (5,6,11,12-tetraphenylnaphthacene) etc., but is not limited thereto. The dopant of the green organic light emitting layer may be $Ir(ppy)_3$ (tris(2-phenylpyridine)iridium (III)) or $Ir(ppy)_2$ (acac) (Bis(2-phenylpyridine) (acetylacetonate) iridium (III)) etc., but is not limited thereto. The dopant of the blue organic light emitting layer may be perylene-based FIrPic(bis(3,5-difluoro-2-(2-pyridyl)phenyl-(2-carboxypyridyl) iridium (III)) etc., but is not limited thereto.

The wavelength of the light emitted from the red organic light emitting layer is in the range from 600 nm to 650 nm and the wavelength of the light emitted from the green organic light emitting layer is in the range from 510 nm to 590 nm. And, the wavelength of the light emitted from the blue organic light emitting layer is in the range from 440 nm to 480 nm.

One organic layers 132, 142, and 152 are respectively disposed between the anodes 131, 141, and 151 and the cathodes 133, 143, and 153 of the red organic light emitting diode 150, the green organic light emitting diode 140, and the blue organic light emitting diode 130 as illustrated in FIG. 2. However, common layers such as an injecting layer and a transporting layer for improving emission efficiency of the organic light emitting diodes other than the organic light emitting layers may be further disposed on each of the organic layers 132, 142, and 152. At least some of the common layers may have a common structure that is commonly disposed on the sub pixels SB, SG, and SR to take advantage in a manufacturing process.

The common structure may be formed using an open common mask for all sub pixels and may be stacked in the same structure on all sub pixels without a specific pattern for each sub pixel. That is, a layer having a common structure is connected or extended from one sub pixel to an adjacent sub pixel without disconnection, so it is shared by a plurality of sub pixels.

For example, other than the organic light emitting layer, at least one organic layer of a hole injection layer, a hole transport layer, an electron blocking layer, and a p-type hole transport layer formed by doping a hole transport layer with a p-type dopant may be further disposed between the anode 141 and the cathode 143 of the green organic light emitting diode 140 for smoother movement of a hole. The hole injection layer, the hole transport layer, the electron blocking layer, or the p-type hole transport layer may have a common structure commonly disposed in the plurality of sub pixels SR, SG, and SB.

And, the organic light emitting diodes 130, 140, and 150 may have one or more light emitting units. One light emitting unit may be composed of an anode, an organic layer, a light emitting layer, and a cathode. One or more light emitting units may have two or more organic layers and light emitting layers between the anode and the cathode and the light emitting unit may be expressed as a stack. And, when two or more light emitting units are provided, it may be expressed as a tandem device. A charge generation layer is disposed between one or more light emitting units, thereby controlling supply and movement of charges between the light emitting units. For example, when two light emitting units are provided, an anode, a first organic layer, a first organic light emitting layer, a charge generation layer, a second organic layer, a second organic light emitting layer, and a cathode may be sequentially stacked. The first organic layer and the second organic layer may include at least one among an electron transport layer, an electron injection layer, and a hole blocking layer other than the hole injection layer, the hole transport layer, the electron blocking layer, and the p-type hole transport layer. And, the first organic layer and the second organic layer may be disposed on or under the first organic light emitting layer and/or the second organic light emitting layer. The first organic light emitting layer and the second organic light emitting layer may emit the same color of light and, for example, they may be at least one among a red organic light emitting layer, a green organic light emitting layer, and a blue organic light emitting layer. In this instance, the first organic light emitting layer and the second organic light emitting layer may emit light in different ways. For example, the first organic light emitting layer may emit light in a phosphorescent type and the second organic light emitting layer may emit light in a fluorescent type. However, the emission type is not limited thereto, and the first organic light emitting layer and the second organic light emitting layer both may emit light in a phosphorescent type or a fluorescent type.

Bank layers 116 may define the sub pixels SR, SG, and SB and expose a portion of the top of each of the anodes 131, 141, and 151. In detail, the bank layer 116 may be disposed to cover the edges of the anodes 131, 141, and 151. The bank layers 116 is made of an insulating material to insulate the anodes 131, 141, and 151 of the sub pixels SR, SG, SB that are adjacent to each other. According to some embodiments, the bank layers 116 may be black banks having high light absorption to suppress mix of color among adjacent sub pixels SR, SG, and SB.

The red sub pixel SR, the green sub pixel SG, and the blue sub pixel SB have emission regions OR, OG, and OB having different areas. The hatched regions in FIG. 1 are emission regions OR, OG, and OB of the red sub pixel SR, the green sub pixel SG, and the blue sub pixel SB. The emission areas of the red sub pixel SR, the green sub pixel SG, and the blue sub pixel SB are adjusted based on the luminance lifetime per unit area of the organic light emitting diodes of the red sub pixel SR, the green sub pixel SG, and the blue sub pixel SB. This will be described in detail below.

As shown in FIG. 1, the red sub pixel SR, the green sub pixel SG, and the blue sub pixel SB are alternately disposed in a transverse direction. For example, sub pixels are sequentially arranged in order of a red sub pixel SR, a green sub pixel SG, and a blue sub pixel SB to the left width direction with respect to the red sub pixel SR disposed at the right uppermost corner in FIG. 1. The emission regions OG of the green sub pixels SG surround the emission region OB of the blue sub pixel SB and the emission region OR of the red sub pixel SR, respectively. For example, the emission regions OG of the green sub pixels SG are disposed to be spaced of the emission region OB of the blue sub pixel SB to surround the emission region OB of the blue sub pixel SB. And, the emission regions OG of the green sub pixels SG are disposed to be spaced from an outline of the emission region OR of the red sub pixel SR to surround the emission region OR of the red sub pixel SR.

The emission region OR of the red sub pixel SR, the emission region OG of the green sub pixel SG, the emission region OB of the blue sub pixel SB are arranged transversely in a zigzag pattern. That is, the emission regions OR, OG, and OB of a plurality of sub pixels SR, SG, and SB are arranged in a zigzag pattern with the emission regions OR, OG, and OB of sub pixels SR, SG, and SB that are adjacent to each other in a transverse direction. For example, the emission region OG of a green sub pixel SG is arranged orthogonally over the emission region OB of a blue sub pixel SB, and the emission region OR of a red sub pixel SR is arranged orthogonally under the emission region OG of the green sub pixel SG. Further, the emission region OB of a blue sub pixel SB is arranged orthogonally under the emission region OG of a green sub pixel SG, and the emission region OR of a red sub pixel SR is arranged orthogonally under the emission region OG of the green sub pixel SG.

Since the emission regions OR, OG, and OB of the sub pixels SR, SG, and SB are transversely arranged in a zigzag pattern, the emission region OG of green sub pixel SG and the emission region OB of a blue sub pixel SB are alternately arranged in a first orthogonal direction D1 with respect to the emission region OG of the left uppermost green sub pixel SG. And, the emission region OG of a green sub pixel SG and the emission region OR of a red sub pixel SR are alternately arranged in a second orthogonal direction D2 with respect to the emission region OG of the right uppermost green sub pixel SG.

Further, since the emission regions OR, OG, and OB of the sub pixels SR, SG, and SB are arranged transversely in a zigzag pattern, the emission regions OR, OG, and OB of specific sub pixels SR, SG, and SB can occupy a portion of the non-emission regions of the other sub pixels SR, SG, and SB. For example, as shown in FIG. 1, the emission region OG of a green sub pixel SG occupies a portion of the non-emission region of adjacent red sub pixel SR and a portion of the non-emission region of an adjacent blue sub pixel SB.

The outlines of each of the emission regions OR, OG, and OB of the red sub pixel SR, the green sub pixel SG, and the blue sub pixel SB are parallel to each other so that the gaps between the emission region OR of the red sub pixel SR, the emission region OG of the green sub pixel SG, and the emission region OB of the blue sub pixel SB are uniform. For example, one outline of the emission region OR of the red sub pixel SR and one outline of the emission region OG of the green sub pixel SG facing the emission region OR of the red sub pixel SR are parallel to each other.

As the emission regions OR, OG, and OB of the red sub pixel SR, the green sub pixel SG, and the blue sub pixel SB are arranged transversely in a zigzag pattern, it is possible to supplement process errors that may be generated in the process of manufacturing the organic light emitting display device 100. Further, it is possible to reduce the sizes of the sub pixels SR, SG, and SB with minimum reduction of the areas of the emission regions of the sub pixels.

In detail, the organic light emitting layer of the organic light emitting display device 100 can be patterned by deposition using an FMM, as described above. The FMM includes an open region opened for each of the emission regions OR, OG, and OB of the sub pixels SR, SG, and SB. A red organic light emitting layer, a green organic light emitting layer, and a blue organic light emitting layer can be deposited to the emission region OR of the red sub pixel SR, the emission region OG of the green sub pixel SG, and the emission region OB of the blue sub pixel SB through the open regions of the FMM, respectively. When the size of the sub pixels SR, SG, and SB are very small, the gaps, i.e. distances among the emission regions OR, OG, and OB of the sub pixels SR, SG, and SB are decreased, and accordingly, the gaps, i.e. distances among the open regions of the FMM are also reduced. In particular, when the organic light emitting display device 100 has high resolution, the size of the sub pixels SR, SG, and SB are very small, so the distances among the emission regions OR, OG, and OB are very small. When the areas of the emission regions OR, OG, and OB are reduced as much as the reduction in size of the sub pixels SR, SG, and SB, the luminance of the sub pixels SR, SG, and SB is reduced and visibility of the organic light emitting display device 100 may be decreased. Accordingly, it is desirable to ensure the areas of the emission regions OR, OG, and OB as large as possible and reduce the size of the sub pixels SR, SG, and SB. However, when the size of the sub pixels SR, SG, and SB is decreased with the areas of the emission regions OR, OG, and OB of the sub pixels SR, SG, and SB maintained, the organic light emitting layers of adjacent sub pixels SR, SG, and SB may overlap each other while being deposited through the FMM. That is, while a deposition material is deposited through the FMM, the material may be unexpectedly deposited to the emission regions OR, OG, and OB of adjacent sub pixels SR, SG, and SB. Accordingly, organic light emitting layers formed on the adjacent sub pixels SR, SG, and SB may overlap each other. Further, the overlapping of the organic light emitting layers may cause color mixture of the organic light emitting layers.

However, when the emission regions OR, OG, and OB of sub pixels SR, SG, and SB are arranged transversely in a zigzag pattern, as shown in FIG. 1, the emission regions OR, OG, and OB of the sub pixels SR, SG, and SB are orthogonally spaced from each other. Accordingly, the distance among the emission regions can be increased as compared with the instance when the emission regions are spaced only transversely. And, the emission regions OR, OG, and OB of the sub pixels SR, SG, and SB can be efficiently arranged in a small area. That is, the emission regions OR, OG, and OB of sub pixels SR, SG, and SB can be spaced at a sufficient distance from each other, so it is possible to minimize the problem with overlapping of organic light emitting layers that may be generated in the process of depositing the organic light emitting layers using an FMM.

Further, the emission regions OR, OG, and OB of the red sub pixel SR, the green sub pixel SG, and the blue sub pixel SB each have a specific shape. For example, as shown in FIG. 1, the red sub pixel SR, the green sub pixel SG, and the blue sub pixel SB have diamond-shaped or rhombus-shaped emission regions OR, OG, and OB. In detail, the emission regions OR, OG, and OB of the red sub pixel SR, the green sub pixel SG, and the blue sub pixel SB are each symmetric with respect to two straight lines perpendicular to each other and passing the centers of the emission regions OR, OG, and OB. As for the emission region OG of the green sub pixel SG, the emission region OG of the green sub pixel SG is symmetric up and down with respect to a virtual horizontal line passing the center thereof and is also symmetric left and right with respect to a virtual vertical line passing the center thereof and perpendicular to the horizontal line.

Although the sub pixels SR, SG, and SB having diamond-shaped or rhombus-shaped emission regions OR, OG, and OB are shown in FIG. 1, the emission regions OR, OG, and OB of the red sub pixel SR, the green sub pixel SG, and the blue sub pixel SB may be formed in various symmetric shapes other than the diamond shape or rhombus shape. For example, the emission regions OR, OG, and OB of the red sub pixel SR, the green sub pixel SG, and the blue sub pixel SB may be formed in a square shape, a regular hexagonal shape, a regular octagonal shape, and a circular shape. The shapes have the characteristic that they are each symmetric with respect to two straight lines passing through the center thereof and perpendicular to each other. When the emission regions OR, OG, and OB of each of the red sub pixel SR, the green sub pixel SG, and the blue sub pixel SB are formed in a symmetric shape, it is possible to minimize defects on the sub pixels SR, SG, and SB that may be generated in the process of manufacturing the organic light emitting display device 100.

In detail, the FMM is a thin metallic type, so it may be sagged or bent by gravity during deposition using a mask. In this instance, the area where an organic light emitting layer is deposited may be distorted and precision of the deposition may be deteriorated. In order to suppress this problem, the FMM may be pulled in specific directions during deposition using a mask and the pulling force may be referred to as a tensile force. However, in this instance, the tensile force is applied to the open regions of the FMM, whereby the open regions of the FMM may be deformed. When the open regions of the FMM are deformed, organic light emitting layers cannot be deposited to accurate positions and the emission regions OR, OG, and OB of sub pixels SR, SG, and SB may overlap each other. Accordingly, a defect may be generated in the sub pixels SR, SG, and SB. On the other hand, when the emission regions OR, OG, and OB of sub pixels SR, SG, and SB each have a symmetric shape, the same tensile force is applied to the open regions of the FMM even though the FMM is pulled during deposition using a mask. Accordingly, since the emission regions OR, OG, and OB of sub pixels SR, SG, and SB each have a symmetric shape, uniform stress can be generated in the open regions when the FMM is pulled during deposition using a mask. Further, the stress at the open regions of the FMM is distributed due to the symmetry of the open areas and accordingly deformation of the open regions of the FMM can be minimized. Accordingly, it is possible to minimize color mixture of the sub pixels SR, SG, and SB due to overlapping the emission regions OR, OG, and OB of the sub pixels SR, SG, and SB by non-uniform stress at the open regions of the FMM that is generated by the difference of tensile force of the FMM that may be caused during deposition using a mask. And, when the emission regions OR, OG, and OB of each of the red sub pixel SR, the green sub pixel SG, and the blue sub pixel SB is formed in a square shape or a regular octagonal shape rather than a rectangular shape, stress that is generated when the FMM is pulled during deposition using a mask can be uniformly distributed. Accordingly, as stress is uniformly distributed at the open regions of sub pixels, deformation of the open regions of the FMM can be minimized and the precision in deposition for forming organic light emitting layers can be improved.

And, as described above, the emission regions OR, OG, and OB of the sub pixels SR, SG, and SB have different areas. For example, as shown in FIG. 1, the emission regions OG of the green sub pixels SG is larger than the emission region OB of the blue sub pixel SB and the emission region OR of the red sub pixel SR. The emission region OB of the blue sub pixel SB is larger than the emission region OR of the red sub pixel SR. This is for maintaining the luminance lifetime of the green sub pixel SG at the same level as the lifetime of the blue sub pixel SB and the lifetime of the red sub pixel SR. However, the areas of the emission regions OR, OG, and OB of the sub pixels SR, SG, and SB are not limited thereto and, if necessary, the areas of the emission regions OR, OG, and OB of the sub pixels SR, SG, and SB may be different. For example, as shown in FIG. 1, the area of the emission regions OG of the green sub pixels SG is larger than the area of the emission region OB of the blue sub pixel SB, and the area of the emission region OB of the blue sub pixel SB is larger than the area of the emission region OR of the red sub pixel SR. Further, the area of the emission region OG of the green sub pixel SG may be larger than the area of the emission region OR of the red sub pixel SR, and the area of the emission region OR of the red sub pixel SR may be larger than the area of the emission region OB of the blue sub pixel SB. Further, the area of the emission region OG of the green sub pixel SG may be the same as the area of the emission region OB of the blue sub pixel SB, and the area of the emission region OB of the blue sub pixel SB may be larger than the area of the emission region OR of the red sub pixel SR.

And, luminance of the organic light emitting diodes 130, 140, and 150 gradually decrease when they are operated for a long period of time. Accordingly, even if the same driving voltage is applied, the luminance of the light from the organic light emitting diodes 130, 140, and 150 may gradually decrease. In this disclosure, the luminance lifetime means the time for which the organic light emitting diodes 130, 140, and 150 emit light with luminance reduced by a predetermined ratio with respect to the initial luminance, when the same voltage is applied to the organic light emitting diodes 130, 140, and 150. For example, luminance lifetime T50 means the time to be taken until the luminance of the organic light emitting diodes 130, 140, and 150 reduces to 50% of the initial luminance, when the organic light emitting diodes 130, 140, and 150 are operated with the maximum luminance.

The luminance lifetime of the organic light emitting diodes 130, 140, and 150 depends on various factors including the kinds of the organic light emitting layers in the organic light emitting diodes 130, 140, and 150 and the thickness of the organic light emitting diodes 130, 140, and 150. For example, when the red sub pixel SR and the green sub pixel SG have phosphorescent organic light emitting diodes 140 and 150 and the blue sub pixel SB have a fluorescent organic light emitting diode 130, the red organic light emitting diode 150, the green organic light emitting diode 140, and the blue organic light emitting diode 130 may be different in luminance lifetime per unit area.

In detail, the red organic light emitting diode 150, the green organic light emitting diode 140, and the blue organic light emitting diode 130 each may include an organic material having a benzene ring. The value of an energy bandgap of the organic materials may depend on the conjugation length of the benzene rings. Since the wavelength of light emitted from an organic light emitting diode may depend on the size of the energy gap of an organic material, the conjugation lengths of the organic materials in the red organic light emitting diode 150, the green organic light emitting diode 140, and the blue organic light emitting diode 130 may be different. For example, the conjugation length may increase in order of the red organic light emitting diode 150, the green organic light emitting diode 140, and the blue organic light emitting diode 130.

And, the longer the conjugation length, the more the coupling structure of organic material is unstable, so the structure of the organic materials easily breaks. Further, in a phosphorescent organic material, a triplet exciton is involved in emission, so the energy bandgap is large and the conjugation length is long in a phosphorescent organic material, as compared with a fluorescent organic material. Accordingly, a phosphorescent organic material as a coupling structure having low stability and short luminance lifetime. The conjugation length generally increases in order of red, green, and blue. However, as a result, when a phosphorescent organic material is used for the red organic light emitting diode 150 and the green organic light emitting diode 140, the conjugation length of the green organic light emitting diode 140 can be larger than the conjugation length of the blue organic light emitting diode 130 using a fluorescent organic material. Accordingly, the luminance lifetime per unit area can be reduced in order of the phosphorescent red organic light emitting diode 150, the fluorescent blue organic light emitting diode 130, and the phosphorescent green organic light emitting diode 140. However, the luminance lifetime per unit area is not limited to thereto and may be changed different from that described above, depending on other factors such as the materials and the thicknesses of the red organic light emitting diode 150, the green organic light emitting diode 140, and the blue organic light emitting diode 130.

The organic light emitting display device 100 according to an embodiment of the present disclosure includes the sub pixels SR, SG, and SB having emission regions OR, OG, and OB having different areas in consideration of the different luminance lifetime per unit area of the organic light emitting diodes 130, 140, and 150 of the sub pixels SR, SG, and SB. This configuration is described in detail with reference to FIG. 3.

Figure 3:
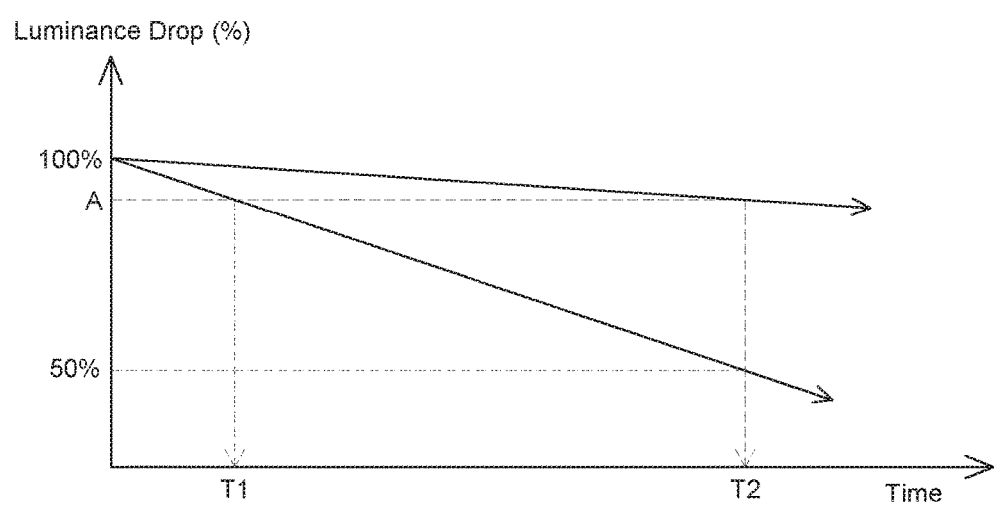
FIG. 3 is a graph showing a luminance lifetime to illustrate a method of adjusting the area of an emission region of a sub pixel in an organic light emitting display device according to an embodiment of the present disclosure.

FIG. 3 is a graph showing a luminance lifetime to illustrate a method of adjusting the area of an emission region of a sub pixel in an organic light emitting display device according to an embodiment of the present disclosure.

The areas of the emission regions OR, OG, and OB of the sub pixels SR, SG, and SB may be adjusted such that the luminance lifetimes of the red sub pixel SR, the green sub pixel SG, and the blue sub pixel SB are the same as T95. The luminance lifetime of T95, which is the time to be taken until the luminance of a predetermined reference sub pixel of the red sub pixel SR, the green sub pixel SG, and the blue sub pixel SB reaches 95% of the initial luminance, is determined as a target luminance lifetime. For example, the target luminance lifetime may be determined with respect to the red sub pixel SR having the longest luminance lifetime per unit area. In this instance, T95 may be determined as the time to be taken until the luminance of the red sub pixel SR emitting light with 255 gradations reaches 95% of the initial luminance.

When the red sub pixel SR is set as a reference sub pixel, the area of the emission region OG of the green sub pixel SG and the area of the emission region OB of the blue sub pixel SB may be adjusted such that the time to be taken until the luminance of the green sub pixel SG and the blue sub pixel SB reaches 95% of the initial luminance becomes the same as T95 that is the target luminance lifetime to be taken until the luminance of the red sub pixel SR reaches 95% of the initial luminance.

To this end, an acceleration factor α may be calculated for each of the green sub pixel SG and the blue sub pixel SB. The acceleration factor α may be calculated from the following Equation 1.

$$\frac{T_1}{T_2} = \left(\frac{L_2}{L_1}\right)^\alpha \quad \text{[Equation 1]}$$

Here, $L_1$ is the maximum luminance value that is the target luminance values of the green sub pixel SG and the blue sub pixel SB and can be maximally presented by the green sub pixel SG and the blue sub pixel SB. For example, $L_1$ may refer to the luminance value when the green sub pixel SG and the blue sub pixel SB emit light with 255 gray. $L_2$ is the luminance value defined as $L_1 \times 0.3$. For example, it refer to a luminance value that becomes 30% of the luminance value when the green sub pixel SG and the blue sub pixel SB emit light with 255 gray. $T_2$ is the time to be taken until the luminance of an organic light emitting diode emitting light with $L_1$ reduces to 50% of the initial luminance, that is, the luminance lifetime T50. In detail, $T_2$ means the time to be taken until the luminance becomes 50% of the initial luminance after the green sub pixel SG or the blue sub pixel SB starts emitting light with the luminance $L_1$. $T_1$ means the time to be taken until the luminance of a certain sub pixel emitting light with the luminance of $L_1$ reduces as much as the reduction of the luminance of a virtual sub pixel emitting light with luminance $L_2$ for the time $T_2$. That is, $T_1$ means the time to be taken until the luminance of a sub pixel that reduces for the time $T_2$ is measured, and then, the luminance of a certain sub pixel emitting light with the luminance $L_1$ reduces to the measured luminance under the assumption that the sub pixel emits light with the luminance $L_2$.

In detail, referring to FIG. 3, FIG. 3 shows a lifetime curve to time of an organic light emitting diode emitting light with the luminance $L_1$ and a lifetime curve to time of an organic light emitting diode emitting light with the luminance $L_2$. Assuming that it is the green sub pixel SG, the luminance lifetime T50 is measured first from the green organic light emitting diode 140 emitting light with the luminance $L_1$. If the green organic light emitting diode 140 emitting light with $L_1$ emits light with luminance of 50% of the initial luminance after the time $T_2$, the luminance lifetime T50 of the green organic light emitting diode 140 becomes $T_2$. And, the green organic light emitting diode 140 emitting light with the luminance $L_2$ that is 30% of $L_1$ may have a luminance reduction speed lower than that of the green organic light emitting diode 140 emitting light with the luminance $L_1$. That is, the green organic light emitting diode 140 emitting light with the luminance $L_2$ lower than $L_1$ is driven by a driving current lower than that for the green organic light emitting diode 140 emitting light with $L_1$.

Accordingly, the green organic light emitting diode 140 may be slowly deteriorated and the luminance reduction speed may be correspondingly decreased. In this instance, when the green organic light emitting diode 140 emitting light with the luminance $L_2$ keeps emitting light for the time $T_1$, the luminance of the green organic light emitting diode 140 emitting light with the luminance $L_2$ may become higher than that of the green organic light emitting diode 140 emitting light with the luminance $L_1$. Assuming that the luminance is A for the convenience of description, the luminance of the green organic light emitting diode 140 emitting light with the luminance $L_2$ reduces to A after the time $T_2$. However, the green organic light emitting diode 140 emitting light with the luminance $L_1$ can reduce to A for a shorter time. In this instance, the time to be taken until the green organic light emitting diode 140 emitting light with the luminance $L_1$ reduces in luminance to A may be defined as $T_1$ in Equation 1.

The acceleration factor α of the green sub pixel SG is calculated from Equation 1. The area of the emission region OG of the green sub pixel SG is calculated by substituting the acceleration factor α into the following Equation 2.

$$T95 = \frac{L1\_T95}{(1/AR)^\alpha} \quad \text{[Equation 2]}$$

Here, AR is the opening ratio of the green sub pixel SG, that is, the ratio of the area of the emission region OG of the green sub pixel SG to the entire area of the green sub pixel SG including the green organic light emitting diode 140 and the thin film transistor 120. L1_T95 is the luminance lifetime T95 of the green sub pixel SG emitting light with the luminance L1, that is, the time to be taken until the luminance of the green sub pixel SG emitting light with the luminance L1 reaches 95% of L1. T95, as described above, a target luminance lifetime, that is, the time to be taken until the luminance of a reference sub pixel reaches 95% of the initial luminance. Since the reference sub pixel was set as the red sub pixel SR above, in this instance, T95 is the time to be taken until the luminance of the red sub pixel SR reaches 95% of the initial luminance.

The opening ratio AR of the green sub pixel SG can be calculated by substituting the acceleration factor α of the green sub pixel SG and L1_T95 of the green sub pixel SG and the target luminance lifetime T95 of the red sub pixel SR into Equation 2. As described above, the opening ratio AR means the ratio of the area of the emission region of a sub pixel to the entire area of the sub pixel, so it is possible calculate the area of the emission region OG of the green sub pixel SG from the opening ratio AR of the green sub pixel SG.

Similarly, it is possible to calculate the acceleration factor and the opening ratio of the blue sub pixel SB, and accordingly, it is possible to adjust the area of the emission region OB of the blue sub pixel SB.

As described above, the luminance lifetime per unit area of the green sub pixel SG including a phosphorescent organic material is low in comparison to the red sub pixel SR including a phosphorescent organic material and the blue sub pixel SB including a fluorescent organic material. Accordingly, the emission region OG of the green sub pixel SG may be larger in area than the emission region OB of the blue sub pixel SB and the emission region OR of the red sub pixel SR, whereby the low luminance lifetime of the green sub pixel SG can be supplemented.

As a result, the organic light emitting display device 100 according to an embodiment of the present disclosure includes a plurality of sub pixels SR, SG, and SB and the area of the emission region OG of the green sub pixel SG of the plurality of sub pixels SR, SG, and SB is the same as or larger than the areas of the emission regions OR and OB of the other sub pixels SR and SB. For example, as shown in FIG. 1, the area of the emission regions OG of the green sub pixels SG may be the same as or larger than the area of the emission region OB of the blue sub pixel SB, and the area of the emission region OB of the blue sub pixel SB may be the same as or larger than the area of the emission region OR of the red sub pixel SR. However, the relationship is not limited thereto, the area of the emission region OG of the green sub pixel SG may be the same as or larger than the area of the emission region OR of the red sub pixel SR, and the area of the emission region OR of the red sub pixel SR may be the same as or larger than the area of the emission region OB of the blue sub pixel SB. The reason that the emission region OG of the green sub pixel SG is the same as or larger than the emission regions OR and OB of the other sub pixels SR and SB is for supplementing the low luminance lifetime of the green sub pixel SG. Further, the area of the emission region OG of the green sub pixel SG may be determined on the based on the acceleration factor $\alpha$ calculated from Equation 1 and the opening ratio AR calculated from Equation 2. In detail, the area of the emission region OG of the green sub pixel SG may be determined such that the luminance lifetime T95 of the green sub pixel SG becomes the same as the luminance lifetime T95 of the red sub pixel SR. In this instance, the luminance of the red sub pixel SR, the green sub pixel SG, and the blue sub pixel SB uniformly reduces. Accordingly, even if the organic light emitting display device 100 is used for a long period of time, the difference in luminance reduces and a change of the white color coordinate of the organic light emitting display device 100 can be minimized, whereby the color of the organic light emitting display device 100 can be uniformly maintained.

Figure 4A:
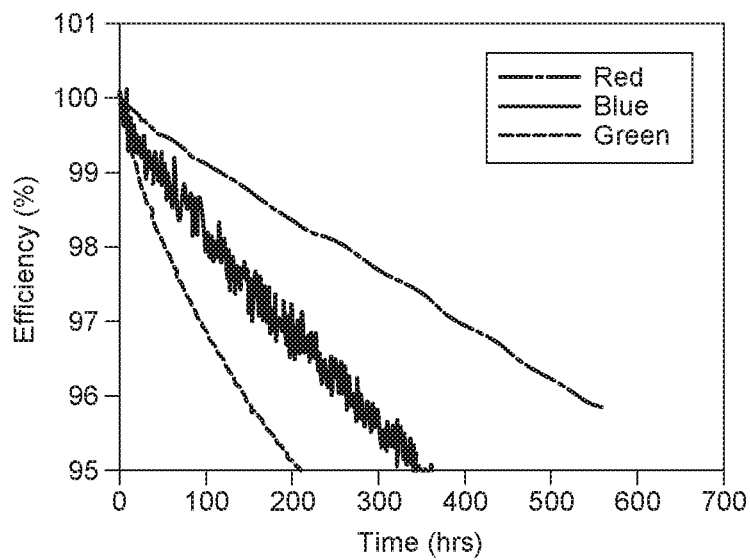
FIGS. 4A and 4B are graphs illustrating an improved luminance lifetime difference in an organic light emitting display device according to an embodiment of the present disclosure.
Figure 4B:
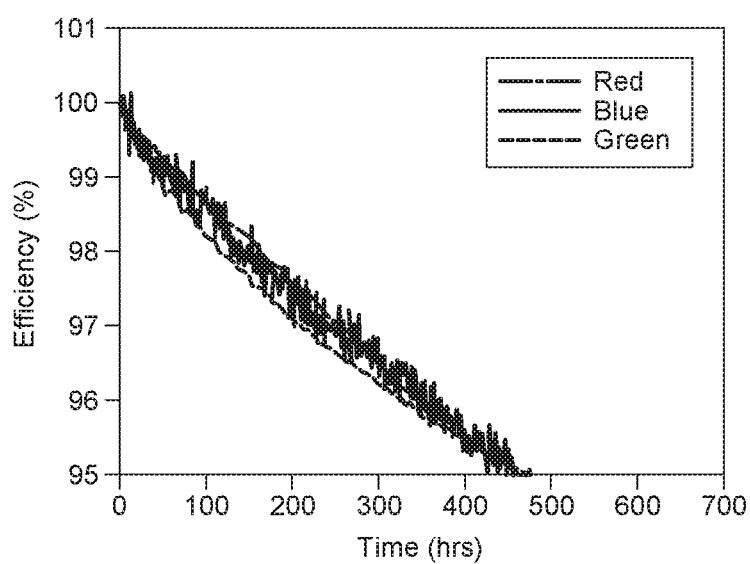

FIGS. 4A and 4B are graphs illustrating an improved luminance lifetime difference in an organic light emitting display device according to an embodiment of the present disclosure. In detail, FIG. 4A is a graph illustrating a luminance lifetime difference of an organic light emitting display device according to a comparative example and FIG. 4B is a graph illustrating an improved luminance lifetime difference of an organic light emitting display device according to an embodiment of the present disclosure.

The organic light emitting display device according to the comparative example and the organic light emitting display device 100 according to an embodiment of the present disclosure each include organic light emitting diodes 130, 140, and 150 formed of the same material in the same structure, except that the emission regions OR, OG, and OB of sub pixels SR, SG, and SB have different areas.

In detail, the graphs of FIG. 4A shows efficiency to time of the organic light emitting display device according to the comparative example including a red sub pixel, a green sub pixel, and a blue sub pixel that have emission regions having the same area. The efficiency means the ratio of a driving current to luminous intensity of light from the red sub pixel, the green sub pixel, and the blue sub pixel. That is, reduction of efficiency of a sub pixel as time passes means reduction of the luminance of the sub pixel under the same driving current, and the faster the reduction to time, the shorter the luminance lifetime of the corresponding sub pixel.

The graph of FIG. 4B shows efficiency to time of the organic light emitting display device 100 according to an embodiment of the present disclosure including a red sub pixel SR, a green sub pixel SG, and a blue sub pixel SB having different emission regions OR, OG, and OB. In the organic light emitting display device 100 according to an embodiment of the present disclosure, the emission regions OR, OG, and OB of the red sub pixel SR, the green sub pixel SG, and the blue sub pixel SB are determined by Equations 1 and 2 such that luminance lifetimes T95 become the same. For example, the opening ratios of red sub pixel SR, the green sub pixel SG, and the blue sub pixel SB are respectively, 13.84, 31.63, and 23.61, and the ratio of the emission regions OR, OG, and OB of the red sub pixel SR, the green sub pixel SG, and the blue sub pixel SB is 1:2.17:1.59.

Referring to FIG. 4A, in the organic light emitting display device according to the comparative example, the emission regions of each of the red sub pixel, the green sub pixel, and the blue sub pixel are determined to be the same regardless of the luminance lifetimes of the red sub pixel, the green sub pixel, and the blue sub pixel. Accordingly, the red sub pixel, the green sub pixel, and the blue sub pixel have different efficiency that is reduced as time passes. Accordingly, it can be found that the organic light emitting display device according to the comparative example changes in color as time passes. That is, when the organic light emitting display device according to the comparative example is used for 300 hours, the efficiency of the green sub pixel drops to less than about 95%, the efficiency of the blue sub pixel drops to about 95.4%, and the efficiency of the red sub pixel drops to about 97.8%. Accordingly, the color coordinate of white achieved by turning on all of the red sub pixel, the green sub pixel, and the blue sub pixel changes and the color of the organic light emitting display device according to the comparative example changes.

Referring to FIG. 4B, the organic light emitting display device 100 according to an embodiment of the present disclosure includes a red sub pixel, a green sub pixel, and a blue sub pixel having different emission regions OR, OG, and OB. Accordingly, when the organic light emitting display device 100 according to an embodiment of the present disclosure is used for 300 hours, the efficiencies of the red sub pixel SR, the green sub pixel SG, and the blue sub pixel SB approach about 96%. Accordingly, the sub pixels all emit light with similar luminance by the same driving current and the color of the organic light emitting display device 100 can be maintained substantially at the same level as that of the organic light emitting display device that has been used for 0 hour. That is, it can be found that the color coordinate of white achieved by turning on all of the red sub pixel, the green sub pixel, and the blue sub pixel is little changed, and the color does not change even by long-period time use.

Figure 5:
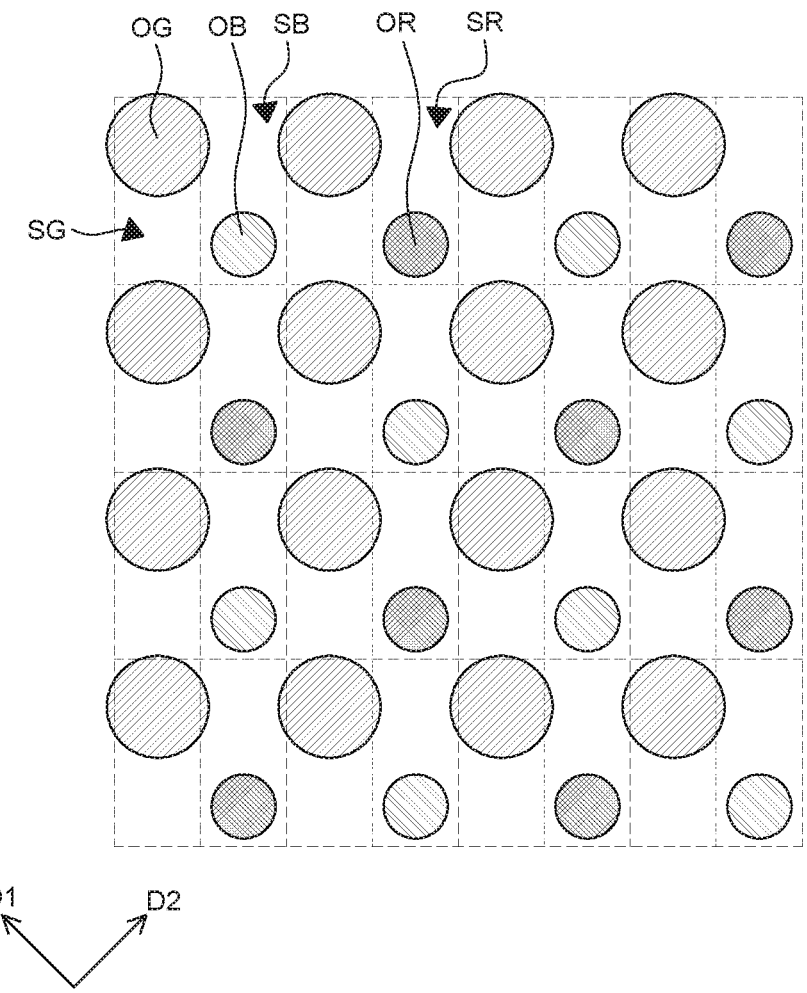
FIG. 5 is a schematic plan view illustrating an organic light emitting display device according to another embodiment of the present disclosure.

FIG. 5 is a schematic plan view illustrating an organic light emitting display device according to another embodiment of the present disclosure. The organic light emitting display device 500 according to another embodiment of the present disclosure is substantially the same as the organic light emitting display device 100 according to an embodiment of the present disclosure, except that the emission region of a sub pixel has a circular shape, so repetitive description is not provided.

Referring to FIG. 5, the emission area OR of a red sub pixel SR, the emission region OG of a green sub pixel SG, and the emission area OB of a blue sub pixel SB are formed in a circular shape. In this instance, since the emission areas OR, OG, and OB have a circular shape, it is possible to more freely arrange the sub pixels SR, SG, and SB. Further, the emission regions OR, OG, and OB of the sub pixels SR, SG, and SB have excellent symmetry as compared with a sub pixel having a rectangular emission region. Accordingly, it is possible to distribute stress generated in the open areas of an FMM during deposition using the FMM and to minimize deformation of the FMM, whereby precision of deposition can be improved. In detail, a circle has less sharp corners in comparison to polygons and the open areas of the FMM that expose the circular emission regions has no sharp corner. As described above, tensile force may be applied to the FMM during deposition using the FMM, and in this instance, stress may be generated in the FMM. In general, stress concentrates on a sharp corner, so when there is a sharp corner at the open areas of the FMM, stress may concentrate on the corners. However, since the FMM having circular open areas has no sharp corners, concentration of stress can be minimized even if stress is generated in the FMM. That is, when the FMM is pulled during deposition using the FMM, stress can be uniformly distributed. Accordingly, damage or deformation of the FMM due to concentration of stress can be minimized and precision of deposition for forming an organic light emitting layer using the FMM can be improved.

Figure 6:
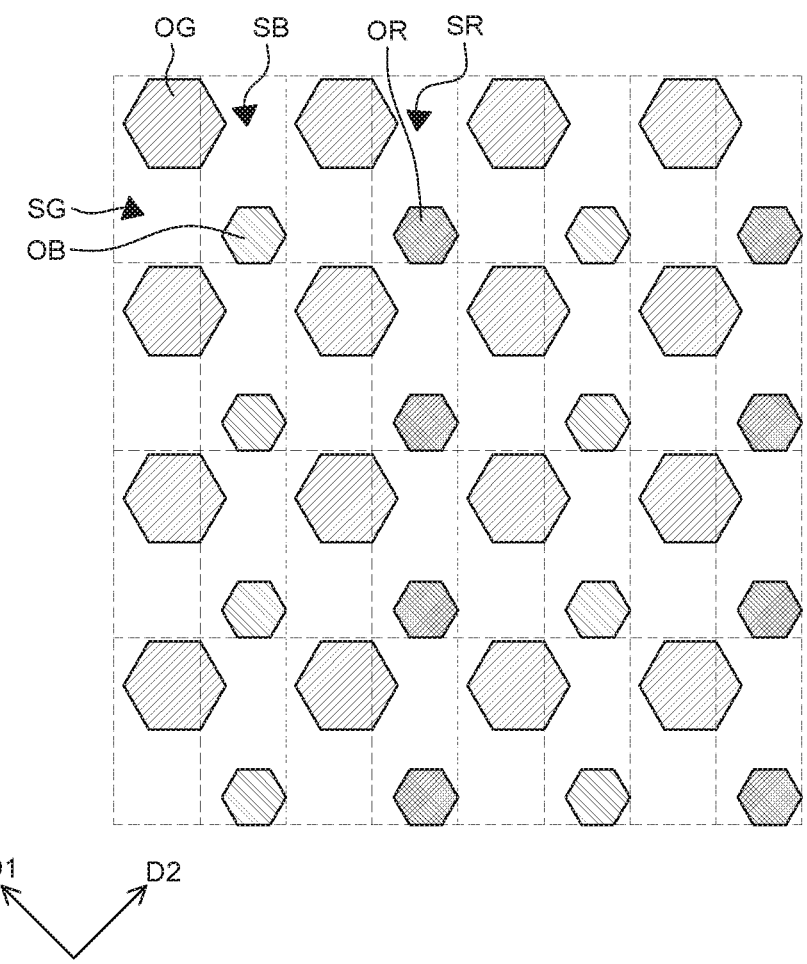
FIG. 6 is a schematic plan view illustrating an organic light emitting display device according to another embodiment of the present disclosure.

FIG. 6 is a schematic plan view illustrating an organic light emitting display device according to another embodiment of the present disclosure. The organic light emitting display device 600 according to another embodiment of the present disclosure is substantially the same as the organic light emitting display device 100 according to an embodiment of the present disclosure, except that the emission region of a sub pixel has a hexagonal shape, so repetitive description is not provided.

Referring to FIG. 6, the emission area OR of a red sub pixel SR, and the emission region OG of a green sub pixel SG, and the emission area OB of a blue sub pixel SB are formed in a hexagonal shape. Similar to the instance when the emission regions OR, OG, and OB of the red sub pixel SR, the green sub pixel SG, and the blue sub pixel SB have a circular shape, when the emission regions OR, OG, and OB of the red sub pixel SR, the green sub pixel SG, and the blue sub pixel SB have a hexagonal shape, the FMM that exposes the emission regions may have a relatively smooth corner. Accordingly, even if tensile force is applied to the FMM during deposition of an organic material to the emission regions, concentration of tensile force on a sharp corner of the FMM can be minimized and, damage or deformation of the FMM can be minimized. That is, when the FMM is pulled during deposition using the FMM, stress can be uniformly distributed.

Figure 7:
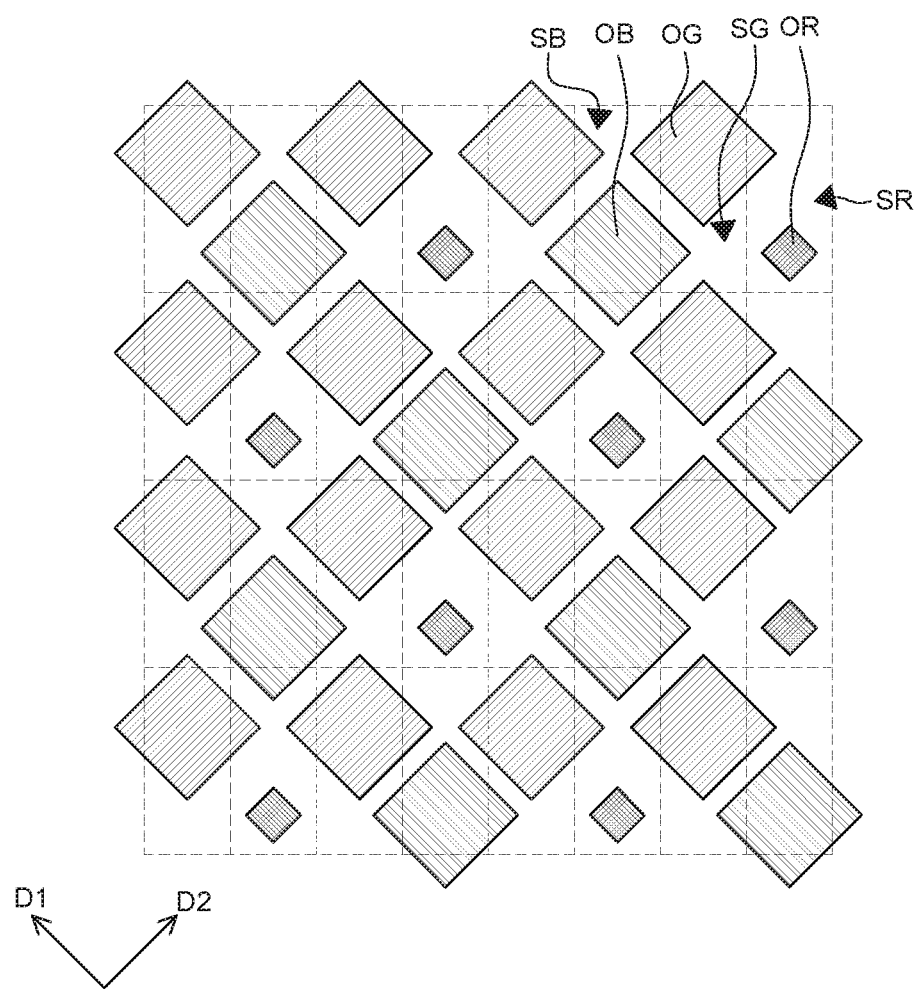
FIG. 7 is a schematic plan view illustrating an organic light emitting display device according to another embodiment of the present disclosure.

FIG. 7 is a schematic plan view illustrating an organic light emitting display device according to another embodiment of the present disclosure. An organic light emitting display device 700 according to another embodiment of the present disclosure is substantially the same as the organic light emitting display device 100 according to an embodiment of the present disclosure, except that the area of the emission region OB of a blue sub pixel SB is substantially the same as the area of the emission region OG of a green sub pixel SG, so repetitive description is not provided.

Referring to FIG. 7, in an organic light emitting display device 700 according to another embodiment of the present disclosure, the emission region OB of the blue sub pixel SB is the same in area as the area of the emission region OG of the green sub pixel SG. This structure may be appropriate when the luminance lifetime per unit area of the blue sub pixel SB is almost the same as the luminance lifetime per unit area of the green sub pixel SG. In detail, the luminance lifetime of a phosphorescent green organic light emitting diode may be almost the same as the luminance lifetime of a fluorescent blue organic light emitting diode. In this instance, the area of the emission region OG of the green sub pixel SG may be the same as the area of the emission region OB of the blue sub pixel SB. In this instance, the entire area of the emission regions of the organic light emitting display device 700 increases, so the luminance of the organic light emitting display device 700 may be further improved. Accordingly, it is possible to achieve an organic light emitting display device 700 having higher luminance.

The example embodiments of the present disclosure can also be described as follows:

According to an aspect of the present disclosure, an organic light emitting display device includes a plurality of sub pixels. Areas of emission regions of green sub pixels of the plurality of sub pixels are the same as or larger than an area of an emission region of at least one non-green sub pixel of the plurality of sub pixels. In the organic light emitting display device according to an embodiment of the present disclosure, an area of an emission region of a green sub pixel having a low luminance lifetime is the same as or larger than areas of emission regions of non-green sub pixels. Accordingly, it is possible to make the luminance lifetime of the green sub pixel and the luminance lifetimes of the non-green sub pixels uniform. Further, it is possible to minimize a color change of the organic light emitting display device.

According to one or more embodiments of the present disclosure, an emission region of anyone sub pixel may be arranged in a zigzag pattern with an emission region of another sub pixel that is adjacent to the anyone sub pixel in a transverse direction.

According to one or more embodiments of the present disclosure, emission regions of each of the plurality of sub pixels may be symmetric with respect to two straight lines that are perpendicular to each other at a center of the emission regions.

According to one or more embodiments of the present disclosure, the plurality of sub pixels may further include a red sub pixel and a blue sub pixel as the at least one non-green sub pixel, and emission regions of the green sub pixels may surround an emission region of the blue sub pixel and an emission region of the red sub pixel, respectively.

According to one or more embodiments of the present disclosure, the emission regions of the green sub pixels may be disposed to be spaced from an outline of the emission region of the blue sub pixel to surround the emission region of the blue sub pixel.

According to one or more embodiments of the present disclosure, the emission regions of the green sub pixels may be disposed to be spaced from an outline of the emission region of the red sub pixel to surround the emission region of the red sub pixel.

According to one or more embodiments of the present disclosure, the plurality of sub pixels may further include red sub pixels and blue sub pixels as the at least one non-green sub pixel, and the red sub pixels, the green sub pixels, and the blue sub pixels may be transversely alternately arranged.

According to one or more embodiments of the present disclosure, the plurality of sub pixels may further include red sub pixels and blue sub pixels as the at least one non-green sub pixel, and the red sub pixels may include a red organic light emitting layer having a phosphorescent organic material. The green sub pixels may include a green organic light emitting layer having a phosphorescent organic material. The blue sub pixels may include a blue organic light emitting layer having a fluorescent organic material.

According to one or more embodiments of the present disclosure, each of the areas of the emission regions of the green sub pixels may be larger than each of the areas of the emission regions of the blue sub pixels, and each of the areas of the emission regions of the blue sub pixels may be larger than each of the areas of the emission regions of the red sub pixels.

According to one or more embodiments of the present disclosure, an opening ratio of the green sub pixels may be about two times an opening ratio of the red sub pixels, and an opening ratio of blue sub pixels may be about one and a half times the opening ratio of the red sub pixels.

According to one or more embodiments of the present disclosure, each of the areas of the emission regions of the green sub pixels may be larger than each of the areas of the emission regions of the red sub pixels, and each of the areas of the emission regions of the red sub pixels may be larger than each of the areas of the emission regions of the blue sub pixels.

According to one or more embodiments of the present disclosure, each of the areas of the emission regions of the green sub pixels may be the same as each of the areas of the emission regions of the blue sub pixels, and each of the areas of the emission regions of the blue sub pixels may be larger than each of the areas of the emission regions of the red sub pixels.

According to one or more embodiments of the present disclosure, each of the emission regions of the plurality of sub pixels may have a symmetric polygonal shape or a symmetric circular shape.

According to one or more embodiments of the present disclosure, each sub pixel of the plurality of sub pixels may include the emission region and a non-emission region, the emission region of the each sub pixel having one of a red color, a green color and a blue color, and the each sub pixel of the plurality of sub pixels having the same size, and the emission region of the green sub pixels may intrude into the non-emission region of the at least one non-green sub pixel.

According to another aspect of the present disclosure, an organic light emitting display device includes a plurality of sub pixels. Areas of the emission regions of each of the plurality of sub pixels are adjusted based on a luminance lifetime per unit area of each of the plurality of sub pixels. The luminance lifetime per unit area of the each of the plurality of sub pixels may be a time to be taken until a luminance of each of the plurality of sub pixels reaches 95% of an initial luminance thereof, a rate of variation in the luminance lifetime per unit area of the plurality of sub pixels may be within 1%. Since the organic light emitting display device according to another embodiment of the present disclosure includes a plurality of sub pixels having emission regions determined on the basis of a luminance lifetime per unit area, a color change of the organic light emitting display device due to differences in luminance lifetimes of the sub pixels may be minimized.

According to one or more embodiments of the present disclosure, the areas of the emission regions of each of the plurality of sub pixels may be adjusted by substituting an acceleration factor α calculated from the following Equation 1 into the following Equation 2.

$$\frac{T_1}{T_2} = \left(\frac{L_2}{L_1}\right)^\alpha \qquad \text{[Equation 1]}$$

$$T95 = \frac{L1\_T95}{(1/AR)^\alpha} \qquad \text{[Equation 2]}$$

As for Equation 1, $L_1$ is the maximum luminance value of a certain sub pixel of which the area of the emission region is calculated, $L_2$ is a luminance value defined as $L_1 \times 0.3$, and $T_2$ is the time to be taken until the luminance of the certain sub pixel reaches 50% of $L_1$. Further, $T_1$ is the time to be taken until the luminance of the certain sub pixel emitting light with the luminance $L_1$ reduces as much as the reduction of the luminance of a virtual sub pixel emitting light with the luminance $L_2$ for the time $T_2$. As for Equation 2, T95 is the time necessary for the luminance of a reference sub pixel among the plurality of sub pixels to reduce to 95% of the initial luminance, and a target luminance lifetime value. L1_T95 is the time to be taken until the luminance of the certain sub pixel emitting light with the luminance $L_1$ reduces to 95% of $L_1$. Further, AR is the opening ratio of the certain sub pixel, that is, the ratio of area of the emission region of the certain sub pixel to the entire area of the certain sub pixel.

According to one or more embodiments of the present disclosure, the plurality of sub pixels may include a red sub pixel, a green sub pixel, and a blue sub pixel. A luminance lifetime per unit area of the red sub pixel may be longer than a limincance lifetime per unit area of the blue sub pixel, the luminance lifetime per unit are of the blue sub pixel may be longer than a luminance lifetime per unit area of the green sub pixel. And, the area of an emission region of the green sub pixel may be the same as or larger than at least one of the area of an emission region of the red sub pixel and the area of an emission region of the blue sub pixel.

According to one or more embodiments of the present disclosure, luminance of each of the red sub pixel, the green sub pixel, and the blue sub pixel may take substantially the same time to reach 95% of the initial luminance thereof.

According to one or more embodiments of the present disclosure, an emission region of any one sub pixel among the plurality of sub pixels may be arranged in a zigzag pattern with the emission region of another sub pixel that is adjacent to the any one sub pixel in a transverse direction. Each of the emission regions of the plurality of sub pixels may be symmetric with respect to two straight lines that are perpendicular at a center of the emission regions.

According to one or more embodiments of the present disclosure, each of the emission regions of the plurality of sub pixels may have a symmetric polygonal shape or a symmetric circular shape.

According to one or more embodiments of the present disclosure, each sub pixel of the plurality of sub pixels may include the emission region and a non-emission region, the emission region of the each sub pixel having one of a red color, a green color and a blue color, and the each sub pixel of the plurality of sub pixels having the same size, and the emission region of a green color sub pixel may intrude into the non-emission region of the at least one non-green color sub pixel.

Although the example embodiments of the present disclosure have been described in detail with reference to the accompanying drawings, the present disclosure is not limited thereto and may be embodied in many different forms without departing from the technical concept of the present disclosure. Therefore, the example embodiments of the present disclosure are provided for illustrative purposes only but not intended to limit the technical concept of the present disclosure. The scope of the technical concept of the present disclosure is not limited thereto. Therefore, it should be understood that the above-described example embodiments are illustrative in all aspects and do not limit the present disclosure. The protective scope of the present disclosure should be construed based on the following claims, and all the technical concepts in the equivalent scope thereof should be construed as falling within the scope of the present disclosure.

What is claimed is:

1. An organic light emitting display device, comprising:
a plurality of sub pixels,
wherein areas of emission regions of green sub pixels of the plurality of sub pixels are the same as or larger than an area of an emission region of at least one non-green sub pixel of the plurality of sub pixels, and
wherein a distance between immediately adjacent emission regions of green sub pixels along each of first and second directions that are perpendicular to each other is less than a distance between immediately adjacent emission regions of non-green sub pixels along the each of the first and second directions.

2. The organic light emitting display device of claim 1, wherein an emission region of any one sub pixel is arranged in a zigzag pattern with an emission region of another sub pixel that is adjacent to the any one sub pixel in a transverse direction.

3. The organic light emitting display device of claim 1, wherein emission regions of each of the plurality of sub pixels are symmetric with respect to two straight lines that are perpendicular to each other at a center of the emission regions.

4. The organic light emitting display device of claim 1, wherein the plurality of sub pixels further include a red sub pixel and a blue sub pixel as the at least one non-green sub pixel, and
emission regions of the green sub pixels surround an emission region of the blue sub pixel and an emission region of the red sub pixel, respectively.

5. The organic light emitting display device of claim 4, wherein the emission regions of the green sub pixels are disposed to be spaced from an outline of the emission region of the blue sub pixel to surround the emission region of the blue sub pixel.

6. The organic light emitting display device of claim 4, wherein the emission regions of the green sub pixels are disposed to be spaced from an outline of the emission region of the red sub pixel to surround the emission region of the red sub pixel.

7. The organic light emitting display device of claim 1, wherein the plurality of sub pixels further include red sub pixels and blue sub pixels as the at least one non-green sub pixel, and
the red sub pixels, the green sub pixels, and the blue sub pixels are transversely alternately arranged.

8. The organic light emitting display device of claim 1, wherein the plurality of sub pixels further include red sub pixels and blue sub pixels as the at least one non-green sub pixel, and
wherein the red sub pixels include a red organic light emitting layer having a phosphorescent organic material,
the green sub pixels include a green organic light emitting layer having a phosphorescent organic material, and
the blue sub pixels include a blue organic light emitting layer having a fluorescent organic material.

9. The organic light emitting display device of claim 8, wherein each of the areas of the emission regions of the green sub pixels is larger than each of the areas of the emission regions of the blue sub pixels, and each of the areas of the emission regions of the blue sub pixels is larger than each of the areas of the emission regions of the red sub pixels.

10. The organic light emitting display device of claim 9, wherein an opening ratio of the green sub pixels is about two times an opening ratio of the red sub pixels, and
wherein an opening ratio of the blue sub pixels is about one and a half times the opening ratio of the red sub pixels.

11. The organic light emitting display device of claim 8, wherein each of the areas of the emission regions of the green sub pixels is larger than each of the areas of the emission regions of the red sub pixels, and each of the areas of the emission regions of the red sub pixels is larger than each of the areas of the emission regions of the blue sub pixels.

12. The organic light emitting display device of claim 8, wherein each of the areas of the emission regions of the green sub pixels is the same as each of the areas of the emission regions of the blue sub pixels, and each of the areas of the emission regions of the blue sub pixels is larger than each of the areas of the emission regions of the red sub pixels.

13. The organic light emitting display device of claim 1, wherein each of the emission regions of the plurality of sub pixels has a symmetric polygonal shape or a symmetric circular shape, and is the same for each of the emission regions of the plurality of sub pixels.

14. The organic light emitting display device of claim 1, wherein each sub pixel of the plurality of sub pixels includes the emission region and a non-emission region, the emission region of the each sub pixel having one of a red color, a green color and a blue color, and the each sub pixel of the plurality of sub pixels having the same size, and
wherein the emission region of the green sub pixels intrude into the non-emission region of the at least one non-green sub pixel.

15. An organic light emitting display device, comprising:
a plurality of sub pixels of a plurality of colors,
wherein areas of emission regions of each of the plurality of sub pixels are adjusted based on a luminance lifetime per unit area of each of the plurality of sub pixels,
wherein a distance between immediately adjacent emission regions of sub pixels of one color along each of first and second directions that are perpendicular to each other is less than immediately adjacent emission regions of sub pixels of colors other than the one color along the each of the first and second directions, and
wherein the luminance lifetime per unit area of the each of the plurality of sub pixels is a time to be taken until a luminance of each of the plurality of sub pixels reaches 95% of an initial luminance thereof, wherein a rate of variation in the luminance lifetime per unit area of the plurality of sub pixels is within 1%.

16. The organic light emitting display device of claim 15, wherein the areas of the emission regions of each of the plurality of sub pixels are adjusted by substituting an acceleration factor α calculated from the following Equation 1 into the following Equation 2, $$\frac{T_1}{T_2} = \left(\frac{L_2}{L_1}\right)^\alpha \quad \text{[Equation 1]}$$

$$T95 = \frac{L1\_T95}{(1/AR)^\alpha} \quad \text{[Equation 2]}$$

where, as for Equation 1, $L_1$ is a maximum luminance value of a certain sub pixel of which the area of the emission region is calculated, $L_2$ is a luminance value defined as $L_1 \times 0.3$, $T_2$ is the time to be taken until a luminance of the certain sub pixel reaches 50% of $L_1$, and $T_1$ is the time to be taken until the luminance of the certain sub pixel emitting light with the luminance $L_1$ reduces as much as a reduction of a luminance of a virtual sub pixel emitting light with the luminance $L_2$ for the time $T_2$, and as for Equation 2, T95 is the time necessary for a luminance of a reference sub pixel among the plurality of sub pixels to reduce to 95% of the initial luminance, and a target luminance lifetime value, L1_T95 is the time to be taken until the luminance of the certain sub pixel emitting light with the luminance $L_1$ reduces to 95% of $L_1$, and AR is an opening ratio of the certain sub pixel, the opening ratio being a ratio of the area of the emission region of the certain sub pixel to an entire area of the certain sub pixel.

17. The organic light emitting display device of claim 16, wherein the plurality of sub pixels include a red sub pixel, a green sub pixel, and a blue sub pixel,
   a luminance lifetime per unit area of the red sub pixel is longer than a luminance lifetime per unit area of the blue sub pixel,
   the luminance lifetime per unit area of the blue sub pixel is longer than a luminance lifetime per unit area of the green sub pixel, and
   the area of an emission region of the green sub pixel is the same as or larger than at least one of the area of an emission region of the red sub pixel and the area of an emission region of the blue sub pixel.

18. The organic light emitting display device of claim 17, wherein luminance of each of the red sub pixel, the green sub pixel, and the blue sub pixel takes substantially the same time to reach 95% of the initial luminance thereof.

19. The organic light emitting display device of claim 15, wherein an emission region of any one sub pixel among the plurality of sub pixels is arranged in a zigzag pattern with an emission region of another sub pixel that is adjacent to the any one sub pixel in a transverse direction, and
   each of the emission regions of the plurality of sub pixels is symmetric with respect to two straight lines that are perpendicular at a center of the emission regions.

20. The organic light emitting display device of claim 15, wherein each of the emission regions of the plurality of sub pixels has a symmetric polygonal shape or a symmetric circular shape, and is the same for each of the emission regions of the plurality of sub pixels.

21. The organic light emitting display device of claim 15,
   wherein each sub pixel of the plurality of sub pixels includes the emission region and a non-emission region, the emission region of the each sub pixel having one of a red color, a green color and a blue color, and the each sub pixel of the plurality of sub pixels having the same size, and
   wherein the emission region of a green color sub pixel intrudes into the non-emission region of the at least one non-green color sub pixel.

* * * * *